US012785445B2

(12) United States Patent
Gill et al.

(10) Patent No.: US 12,785,445 B2
(45) Date of Patent: Nov. 3, 2026

(54) METHOD AND APPARATUS FOR INCREASED RF HARVESTING SENSITIVITY THROUGH MULTI-STAGE Q-MULTIPLIED VOLTAGE

(71) Applicant: Powercast Corporation, Pittsburgh, PA (US)

(72) Inventors: Jason Arthur Gill, Pittsburgh, PA (US); John Robert Roney, Renfrew, PA (US); Richard T. Brophy, Lansdale, PA (US); Charles Edward Greene, Butler, PA (US); Eric James Biel, Glenshaw, PA (US)

(73) Assignee: Powercast Corporation, Pittsburgh, PA (US)

( * ) Notice: Subject to any disclaimer, the term of this patent is extended or adjusted under 35 U.S.C. 154(b) by 0 days.

(21) Appl. No.: 18/767,690

(22) Filed: Jul. 9, 2024

(65) Prior Publication Data

US 2024/0364137 A1 Oct. 31, 2024

Related U.S. Application Data

(63) Continuation of application No. PCT/US2024/010377, filed on Jan. 4, 2024.

(Continued)

(51) Int. Cl.

*H02J 50/00* (2016.01)
*H02J 50/20* (2016.01)
*H03H 7/40* (2006.01)

(52) U.S. Cl.

CPC ............ *H02J 50/001* (2020.01); *H02J 50/20* (2016.02); *H03H 7/40* (2013.01)

(58) Field of Classification Search

CPC ........... H02J 50/001; H02J 50/20; H03H 7/40
See application file for complete search history.

(56) References Cited

U.S. PATENT DOCUMENTS 9,768,711 B2 9/2017 Hameed et al.
9,979,240 B2 * 5/2018 Parks ...................... H02J 50/20

(Continued)

FOREIGN PATENT DOCUMENTS

WO WO-2024148207 A2 7/2024

OTHER PUBLICATIONS

International Search Report and Written Opinion for PCT Application No. PCT/US2024/010377 dated Jun. 5, 2024, 13 pages.

(Continued)

*Primary Examiner* — Rexford N Barnie
*Assistant Examiner* — Joseph N Inge
(74) *Attorney, Agent, or Firm* — COOLEY LLP

(57) ABSTRACT

In some embodiments, an apparatus includes an antenna and a rectifier operatively coupled to the antenna and configured to receive an input power via the antenna. The rectifier can include a plurality of stages, each stage of the plurality of stages including a tuning network including one or more lumped elements. An initial stage can be configured to receive the input power and produce a power based on the input power. Each stage of the plurality of stages coupled to the antenna via at least one previous stage can be configured to receive a power from the previous stage and to produce a subsequent power associated with (e.g., based on) the power received from the previous stage. The rectifier can be configured to output a power associated with a direct current (DC) voltage having a voltage level based on a voltage level associated with the input power.

20 Claims, 9 Drawing Sheets

Related U.S. Application Data

(60) Provisional application No. 63/437,110, filed on Jan. 4, 2023.

(56) References Cited

U.S. PATENT DOCUMENTS

| | | | | |
|---|---|---|---|---|
| 10,484,111 | B2 | 11/2019 | Greene et al. | |
| 11,070,093 | B1 * | 7/2021 | Papadopoulos | H02J 50/005 |
| 11,245,257 | B2 | 2/2022 | Greene et al. | |
| 11,368,053 | B2 | 6/2022 | Greene et al. | |
| 11,394,246 | B2 | 7/2022 | Shearer et al. | |
| 11,418,234 | B2 | 8/2022 | Greene | |
| 2009/0067208 | A1 | 3/2009 | Martin et al. | |
| 2009/0309417 | A1 | 12/2009 | Walley | |
| 2017/0373662 | A1 * | 12/2017 | Kumar | H03H 7/38 |
| 2019/0067802 | A1 * | 2/2019 | Carter | H01Q 9/045 |
| 2019/0305606 | A1 * | 10/2019 | Jiang | H02J 50/20 |
| 2020/0195232 | A1 * | 6/2020 | Greene | H02M 3/04 |
| 2022/0385062 | A1 | 12/2022 | Greene et al. | |

OTHER PUBLICATIONS

Invitation to pay additional fees for International Application No. PCT/US2024/010377 dated Apr. 5, 2024, 2 pages.

* cited by examiner

200

METHOD AND APPARATUS FOR INCREASED RF HARVESTING SENSITIVITY THROUGH MULTI-STAGE Q-MULTIPLIED VOLTAGE

CROSS-REFERENCE TO RELATED APPLICATIONS

This application is a continuation of International Patent Application No. PCT/US2024/010377, entitled “Method and Apparatus for Increased RF Harvesting Sensitivity Through Multi-Stage Q-Multiplied Voltage,” filed Jan. 4, 2024, which claims priority to and the benefit of U.S. Provisional Patent Application No. 63/437,110, entitled “Method and Apparatus for Increased RF Harvesting Sensitivity Through Multi-Stage Q-Multiplied Voltage,” filed Jan. 4, 2023, the disclosure of each of which is incorporated by reference herein in its entirety.

BACKGROUND

Some embodiments described herein relate generally to systems, methods, and apparatus for increasing radio-frequency (RF) harvesting sensitivity through multi-stage Q-multiplied voltage.

With the proliferation of the Internet-of-Things, more electronic devices are deployed in the world than ever before. These devices operate using some form of energy, which typically is provided by a small battery or capacitor. Advancements in both rechargeable battery and capacitor technologies have made it possible to trickle-charge these devices with very low amounts of energy, enabling longer device life when deployed. RF energy harvesting is one approach to achieve this trickle-charging effect to supplement the amount of stored energy in electronic devices.

Given that many RF energy signals, such as ambient RF energy signals, are low power, increased sensitivity of RF energy harvesters is desirable to convert useful amounts of energy that can be used to recharge (i.e., increase the amount or level of stored energy in one or more energy storage elements of) devices. With enhanced sensitivity, lower power RF signals can be converted to useable energy to recharge energy storage elements or components of electronic devices (e.g., wireless devices) more effectively at, for example, farther distances. Enhanced sensitivity, however, is typically associated with decreased efficiency of the overall RF energy harvesting system.

Thus, a need exists for RF energy harvesting methods, apparatus, and systems that have increased sensitivity to RF energy signals and operate efficiently.

SUMMARY

In some embodiments, an apparatus includes an antenna and a rectifier. The rectifier can be operatively coupled to the antenna and configured to receive an input power via the antenna. The rectifier can include a plurality of stages, each stage of the plurality of stages including a tuning network including one or more lumped elements. The plurality of stages can include an initial stage configured to receive the input power and produce a power based on the input power. Each stage of the plurality of stages coupled to the antenna via at least one previous stage can be configured to receive a power from the previous stage and to produce a subsequent power associated with (e.g., based on) the power received from the previous stage. The rectifier can be configured to output a power associated with a direct current (DC) voltage associated with the input power received by the rectifier via the antenna. The voltage level of the DC voltage can be based on a voltage level associated with the input power.

DETAILED DESCRIPTION

Figure 1:
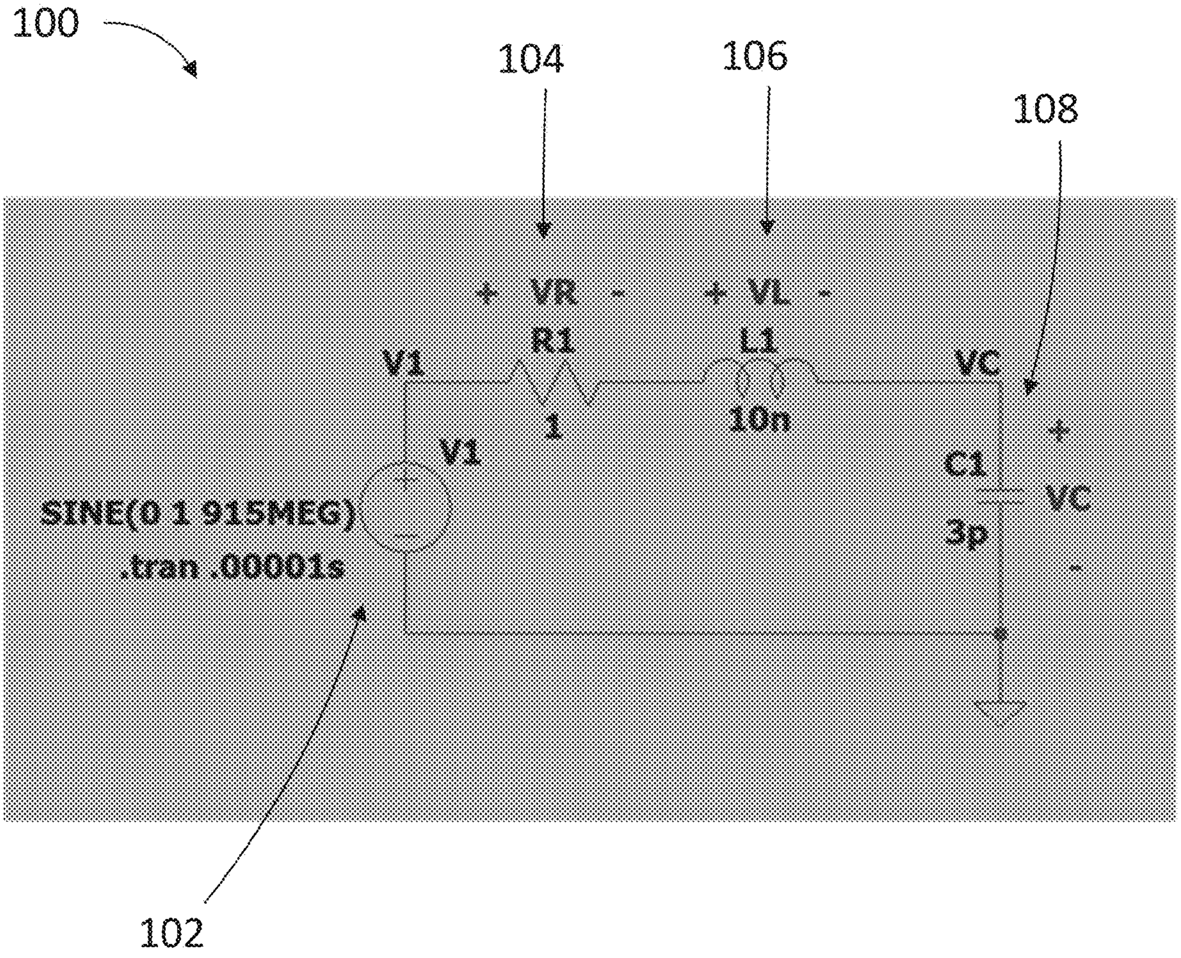
FIG. 1 is a schematic illustration of an RLC circuit, according to an embodiment.

In some embodiments, an apparatus includes an antenna and a rectifier. The rectifier can be operatively coupled to the antenna and configured to receive an input power via the antenna. The rectifier can include a plurality of stages, each stage of the plurality of stages including a tuning network including one or more lumped elements. The plurality of stages can include an initial stage configured to receive the input power and produce a power based on the input power. Each stage of the plurality of stages coupled to the antenna via at least one previous stage can be configured to receive a power from the previous stage and to produce a subsequent power associated with (e.g., based on) the power received from the previous stage. The rectifier can be configured to output a power associated with a direct current (DC) voltage associated with the input power received by the rectifier via the antenna. The voltage level of the DC voltage can be based on a voltage level associated with the input power.

In some embodiments, an apparatus includes an antenna, a first tuning network, a first rectifier, a second tuning network, and a second rectifier. The first tuning network can be operatively coupled to the antenna and configured to receive radio-frequency (RF) power via the antenna and to output a first RF power based on the received RF power. The first RF power can have a first voltage level. The first rectifier can be operatively coupled to the first tuning network and configured to receive the first RF power and output a second RF power having a second voltage level based on the first voltage level. The second tuning network can be operatively coupled to the first rectifier and configured to receive the second RF power from the first rectifier and to output a third RF power based on the second RF power. The third RF power can have a third voltage level based on the second voltage level. The second rectifier can be operatively coupled to the second tuning network and configured to receive the third RF power and output a fourth RF power having a fourth voltage level based on the third voltage level.

In some embodiments, an apparatus includes an antenna, a first tuning network, a first rectifier, a second tuning network, and a second rectifier. The first tuning network can be operatively coupled to the antenna and configured to receive at least a portion of a radio-frequency (RF) power received via the antenna and to output a first RF power based on the portion of RF power received at the first tuning network. The first RF power can have a first voltage level. The first rectifier can be operatively coupled to the first tuning network and configured to receive the first RF power and output a first multiplied RF power having a second voltage level based on the first voltage level. The second tuning network can be operatively coupled to the antenna and electrically coupled in parallel to the first tuning network. The second tuning network can be configured to receive at least a portion of the RF power received via the antenna and to output a second RF power based on the portion of the RF power received at the second tuning network. The second RF power can have a third voltage level. The second rectifier can be operatively coupled to the second tuning network and configured to receive the second RF power and output a second multiplied RF power having a fourth voltage level based on the third voltage level.

In some embodiments, an apparatus includes an antenna, a first tuning network, a first rectifier, a second tuning network, and a second rectifier. The first tuning network can be operatively coupled to the antenna and configured to receive radio-frequency (RF) power via the antenna and to output a first RF power based on the received RF power. The first rectifier can be operatively coupled to the first tuning network and can be configured to receive a portion of the first RF power having a first voltage level from the first tuning network and to output a first multiplied RF power having a second voltage level based on the first voltage level. The second tuning network can be operatively coupled to the first tuning network and configured to receive a portion of the first RF power having the first voltage level from the first tuning network and to output a second RF power based on the portion of the first RF power received at the second tuning network. The second RF power can have a third voltage level based on the first voltage level. The second rectifier can be operatively coupled to the second tuning network and can be configured to receive the second RF power and output a second multiplied RF power having a fourth voltage level based on the third voltage level.

In some embodiments, RF harvesting systems include multiple harvesting stages to achieve increased front-end sensitivity. Generally, the more stages that are included in an RF harvesting system, the greater the sensitivity of the RF harvesting system. In some embodiments, RF harvesting systems include a rectifier (e.g., multi-stage voltage multiplier circuit such a multi-stage voltage doubler). To achieve a certain output voltage using a single-stage voltage doubler circuit (also referred to herein as a "voltage doubler") in an RF harvesting system, the input peak voltage should be half of the desired output voltage plus the forward voltage of a rectifying element (e.g., a rectifier) of the RF harvesting system. When including two harvesting stages in an RF harvesting system, each stage including a voltage doubler, the output voltage of the first stage should be half of the total output voltage of the two harvesting stages (i.e., half of the output of the second harvesting stage). Thus, the input peak voltage to the first harvesting stage should be roughly a quarter of the desired total output voltage plus all the rectifying element voltage drops present. The input power or input peak voltage associated with a certain output voltage of a multi-stage RF harvesting system decreases as more stages are added.

Each added stage, however, decreases the overall efficiency of a multi-stage RF harvesting system due to the associated addition of more rectifying element forward voltage drop losses as each stage is added. For example, when a second stage is added, the RF path has twice as many voltage drops that contribute to power loss. The system may also have more inefficiencies due to longer traces being present on a printed circuit board (PCB) included in the system or to which the system is coupled. As more stages are added or included in an RF harvesting system, a point will eventually be reached in which the power losses are greater than the input power and the circuit will not rectify no matter how many stages are added.

These limitations, which are intrinsic to RF harvesting systems using multiple harvesting stages, can be overcome or reduced in impact by including an inductor-capacitor (LC) tank circuit(s) (also referred to as an LC tank, an LC Q-multiplied voltage tank, or a Q-multiplied voltage circuit) in a tuning network to achieve a Q-multiplied voltage at an input to each harvesting stage (also referred to as a rectifier stage) of an RF harvesting system. In some embodiments, such a circuit arrangement (e.g., including an LC tank circuit(s) in a tuning network) can also be combined with the approach of including multiple harvesting stages, each of which may or may not have (e.g., include or be associated with) its own LC tank circuit. This circuit arrangement (e.g., use of an LC tank circuit in a tuning network) increases the overall sensitivity of the harvester circuit by taking advantage of the reduced input power or input peak voltage associated with a certain output voltage of the multistage harvester, and adding an LC Q-multiplied voltage tank at the input to each harvester stage. Where some RF harvesting systems include a tuning network at the input to a RF harvester system, this approach includes a Q-multiplied voltage circuit at the input of each stage of a multistage RF harvester system.

RF power harvesting sensitivity is typically limited by the ability of received RF power to overcome the forward voltage drop of a rectifying device and conduct current through the rectifying device. The peak voltage at the input to the rectifying device is set by the amount of received RF power and the characteristic impedance of the RF harvesting system. Including an LC tank circuit at the input to a rectifier enables an RF tuning network (also referred to as an RF matching network or a tuning network) including the LC tank circuit to resonate at the frequency of the received RF power and produce Q-multiplied voltage. This allows the peak voltage at the input of the rectifier to swing to higher voltage levels than without such an RF tuning network. For example, FIG. 1 is a schematic illustration of a series RLC circuit 100 including a power source 102, a resistor 104, an inductor 106, and a capacitor 108. Below are equations showing Q-multiplied voltage across a capacitor at resonance, such as the capacitor of the RLC circuit 100 shown in FIG. 1.

$$Vc = I * \frac{1}{jwC1} = \frac{I}{jXc}, \text{ @ resonance } I = \frac{V1}{R1}$$

$$Vc = \left(\frac{V1}{R1}\right) * \left(\frac{1}{jwC1}\right)$$

$$Vc = -jwC1 * \frac{V1}{R1} = -jQ * V1, \text{ where } Q = \frac{Xc}{R1}$$

$$|Vc| = Q * V$$

Figure 2:
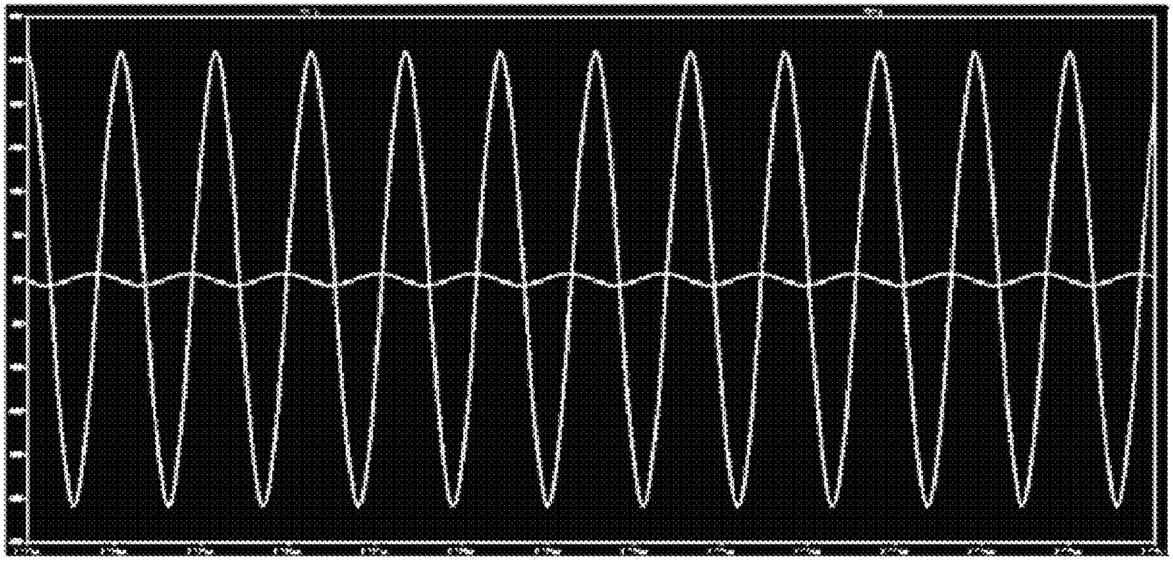
FIG. 2 is a graph 200 showing Q-multiplied voltage across the capacitor of the RLC circuit shown in FIG. 1.

FIG. 2 is a graph 200 showing Q-multiplied voltage across the capacitor of the RLC circuit 100 shown in FIG. 1. The Q-multiplied voltage swing shown in FIG. 2, for example, can more easily overcome the forward voltage drops of one or more harvester stages (e.g., one or more rectifiers) at lower RF input powers than non-Q-multiplied voltage networks. This technique yields an RF harvesting system having improved harvesting sensitivity. This Q-multiplied voltage can be added to multiple stages of an RF harvester (e.g., by including a Q-multiplied voltage network at the input to each stage), improving overall harvester sensitivity.

Although tuning networks are often included only at the front-end RF input of a known multistage voltage multiplier circuit, in some embodiments, an RF energy harvesting circuit can include a Q-multiplied voltage network coupled in between each stage of a rectifier (e.g., a multistage voltage multiplier circuit). In some embodiments, the tuning network(s) included in an RF harvesting system including a Q-multiplied voltage network can include one or more resistor(s), capacitor(s), inductor(s), or any combination of the three in any ratio. In some embodiments, the tuning network(s) can be configured to use the inherent properties of one or more harvesters included in the RF harvesting system as part of the tuning network(s) itself, such as the junction capacitance of a diode. Using the tuning network (s), a Q-multiplied voltage can be generated in between various stages of the RF harvesting system and used to obtain a higher peak voltage at the input to one or more rectifier stages. This higher peak voltage enables overcoming the forward voltage of a rectifier (also referred to as a rectifying device or a rectifying element) at lower input powers, thus increasing the sensitivity of the RF harvesting system with respect to the range of power levels of RF signals that can be converted by the RF harvesting system to useable energy. The Q-multiplied voltage network may also increase efficiency by reducing an impedance mismatch between consecutive stages of a voltage multiplier.

In some embodiments, the tuning network, such as any of the tuning networks described herein, can be or include a Q-multiplied voltage network. In some embodiments, the tuning network, such as any of the tuning networks described herein, such as the Q-multiplied voltage networks, can be or include a lumped element network including one or more lumped elements. In some embodiments, the one or more lumped elements can be configured to generate a q-multiplied voltage based on the received input power such that the power (e.g., tuned power) produced by each stage is a q-multiplied voltage of the received input power or power (e.g., tuned power) received by that stage. In some embodiments, the one or more lumped elements from the tuning network of the initial stage are configured to impedance match the antenna to the rectifier (e.g., a voltage multiplier circuit such as a voltage doubler). In some embodiments, the one or more lumped elements from a tuning network of at least one stage from a plurality of stages are configured to bias at least one remaining stage from the plurality of stages (e.g., a stage before or after the current stage). In some embodiments, the one or more lumped elements can include at least one parasitic (e.g., a junction capacitance of a rectifying element). In some embodiments, the one or more lumped elements can include a series combination of an inductor and capacitor (LC). In some embodiments, the one or more lumped elements include an "L" network including an inductor and a capacitor. In some embodiments, the one or more lumped elements include a "Pi" network including a combination of one or more inductors and one or more capacitors.

In some embodiments, an RF harvesting system can include a Q-multiplied voltage network as described herein in conjunction with (e.g., coupled to an input of) harvesters or harvester stages including, but not limited to, one or more Villard circuits, one or more Greinacher circuits, one or more Delon circuits, and/or one or more Dickson charge pumps, as well as one or more half-wave and/or one or more full-wave rectifiers. In some embodiments, an energy harvesting system including a Q-multiplied voltage network as described herein can improve the sensitivity of any energy harvesting system that is configured to harvest an RF or AC signal, such as RF energy harvesting, when compared to an energy harvesting system without a Q-multiplied voltage network.

Figure 12:
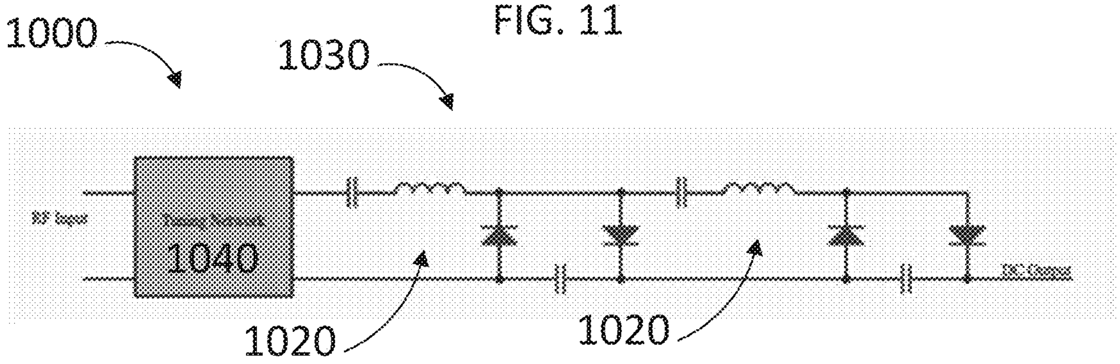
FIG. 12 is a schematic illustration of a system including a multistage voltage multiplier and inductors such that an inductor-capacitor (LC) tank is included at each harvesting stage, according to an embodiment.
Figure 13:
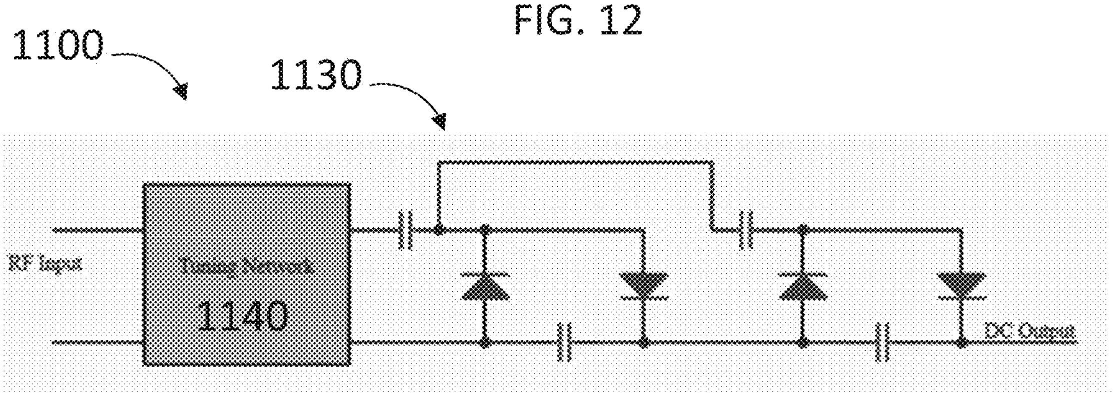
FIG. 13 is a schematic illustration of a system including a multistage voltage multiplier and a front-end tuning network, according to an embodiment.
Figure 14:
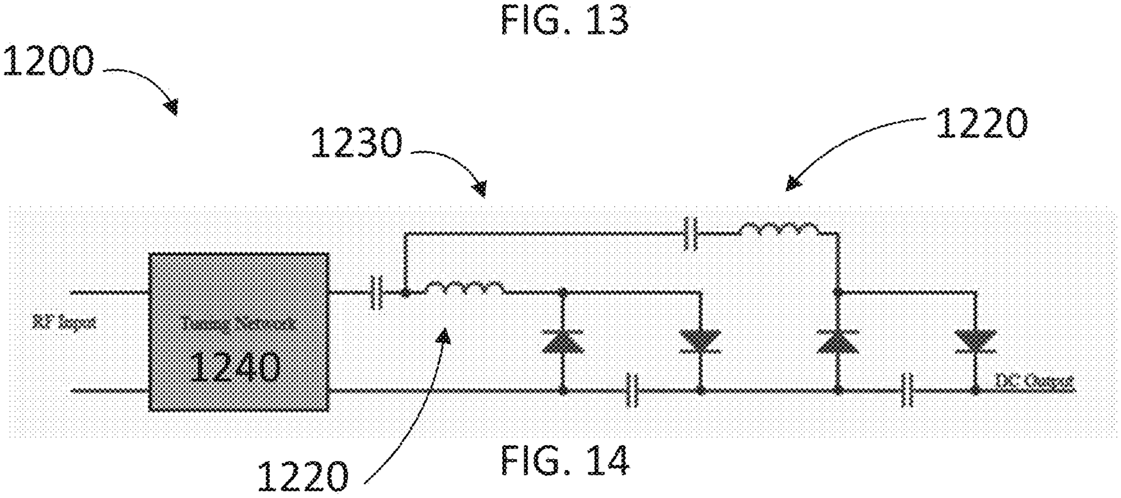
FIG. 14 is a schematic illustration of a system including a multistage voltage multiplier and inductors such that an LC tank is included at each harvesting stage, according to an embodiment.

In some embodiments, an RF energy harvesting system can include only one voltage multiplication stage. In some embodiments, an RF energy harvesting system can include multiple voltage multiplication stages. In some embodiments, each stage may or may not have (e.g., be associated with or have an input coupled to receive an input voltage from) its own tuning network and/or Q-multiplying voltage components. In some embodiments, an RF energy harvesting system can optionally include an overall front-end tuning network (e.g., an additional front-end tuning) at the RF input configured to both impedance match to the antenna and to provide Q-multiplied voltage to the entire RF energy harvesting system, such as is shown in FIGS. 12-14.

In some embodiments, the Q-multiplying components or Q-multiplying voltage network can be placed or located directly in front of (e.g., electrically coupled directly to) the input to that stage of the harvesting circuit. In some embodiments, the Q-multiplying components or Q-multiplying voltage network can be placed or located at other places in the circuit (e.g., directly electrically coupled to other components and/or other locations than the input to a stage, such as the output of one stage or in the middle of a stage). In some embodiments, the Q-multiplying voltage network of a following stage can be connected into or after (e.g., directly coupled to) the Q-multiplying voltage network of the previous stage, letting the following stages Q-multiplied voltage amplify the already Q-multiplied voltage of the previous stage. In some embodiments, the inputs of each harvesting stage can be connected to their own Q-multiplying voltage network, while the outputs of each harvesting stage can be connected (e.g., electrically coupled) in parallel or series.

Figure 3:
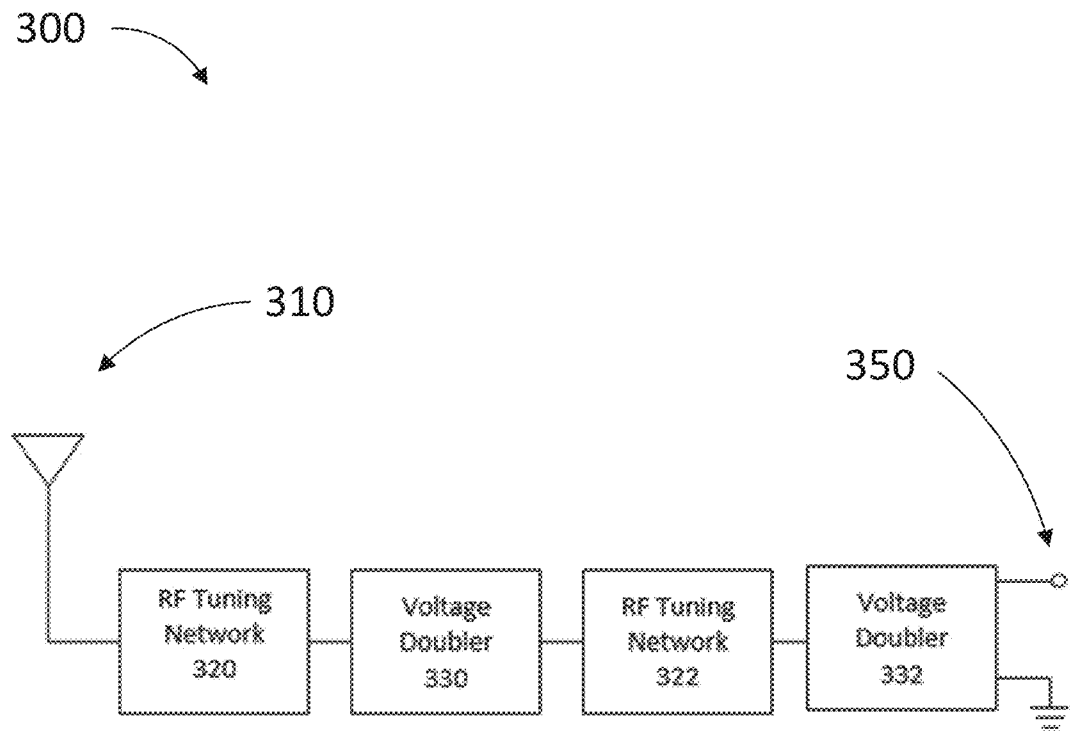
FIG. 3 is a schematic illustration of an energy harvesting system, according to an embodiment.

FIG. 3 is a schematic illustration of an energy harvesting system 300. The system 300 includes multiple RF tuning networks coupled in a series configuration. As shown, the system 300 includes an antenna 310, a first RF tuning network 320, a second RF tuning network 322, a first voltage doubler 330, and a second voltage doubler 332. The first RF tuning network 320 is operatively coupled to the antenna 310 and configured to receive an RF signal including RF power received via the antenna. An output of the first RF tuning network 320 is coupled to an input of the first voltage doubler 330. An output of the first voltage doubler 330 is coupled to an input of the second RF tuning network 322. An output of the second RF tuning network 322 is coupled to an input of the second voltage doubler 332. The second voltage doubler 332 has an output coupled to an output 350. Each of the first RF tuning network 320 and the second RF tuning network 322 can be the same or similar in structure and/or function to any of the tuning networks described herein. For example, one or both of the first RF tuning network 320 and the second RF tuning network 322 can include a Q-multiplied voltage circuit. Each of the first voltage doubler 330 and the second voltage doubler 332 can be the same or similar in structure and/or function to any of the voltage doublers described herein.

As shown, the first RF tuning network 320 can be configured to output a first RF power based on the received RF power from the antenna 310. The first RF power can have a first voltage level. The first voltage doubler 330 can be operatively coupled to the first tuning network 320 and configured to receive the first RF power and output a second RF power having a second voltage level associated with (e.g., based on) the first voltage level of the first RF power. The second tuning network 322 can be operatively coupled to the first voltage doubler 330 and configured to receive the second RF power from the first voltage doubler 330 and to output a third RF power associated with (e.g., based on) the second RF power. The third RF power can have a third voltage level associated with (e.g., based on) the second voltage level. The second voltage doubler 332 can be operatively coupled to the second tuning network 322 and configured to receive the third RF power and output a fourth RF power having a fourth voltage level associated with (e.g., based on) the third voltage level. Although described as voltage doublers, in some embodiments, the first voltage doubler 330 and the second voltage doubler 332 can each be a rectifier other than a voltage doubler, such as a voltage multiplier other than a voltage doubler. In some embodiments, although not shown, the system 300 can include an RF front-end tuning network operatively coupled to the antenna 310 and the first RF tuning network 320. The RF front-end tuning network can be configured to receive the RF power from the antenna and to send the RF power received from the antenna to the first tuning network 320. In some embodiments, the first RF tuning network 320 is configured to produce a Q-multiplied voltage such that a voltage associated with the first voltage level is Q-multiplied compared to a voltage associated with the RF power received from the antenna, and the second RF tuning network is configured to produce a Q-multiplied voltage such that a voltage associated with the third voltage level is Q-multiplied compared to a voltage associated with the second voltage level.

Figure 4:
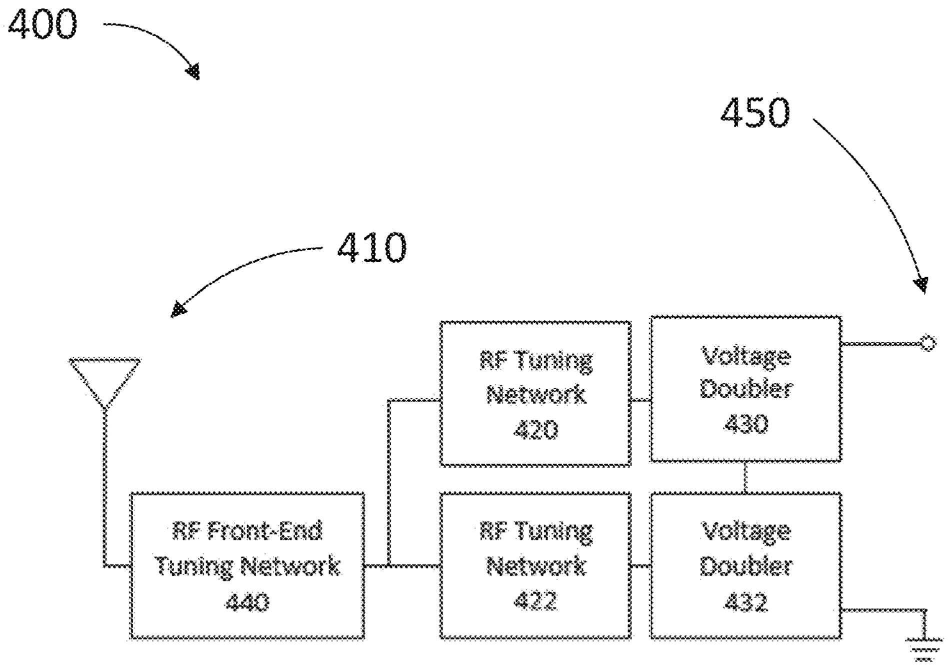
FIG. 4 is a schematic illustration of an energy harvesting system, according to an embodiment.

FIG. 4 is a schematic illustration of an energy harvesting system 400. The system 400 includes two RF tuning networks coupled in a parallel configuration, with each of the two RF tuning networks coupled to a respective voltage doubler, and having a single output. As shown, the system 400 includes an antenna 410, a first RF tuning network 420, a second RF tuning network 422, a first voltage doubler 430, and a second voltage doubler 432. The system 400 also includes an RF front-end tuning network 440 disposed between the antenna 410 and the two tuning networks (i.e., the first RF tuning network 420 and the second RF tuning network 422). The first RF tuning network 420 and the second RF tuning network 422 are coupled in parallel such that an input of each tuning network is coupled to an output of the RF front-end tuning network 440 and configured to receive an output of the RF front-end tuning network 440. The RF front-end tuning network 440 is operatively coupled to the antenna 410 and configured to receive an RF signal from the antenna 410 (i.e., received via the antenna 410) and to provide the RF signal to the first RF tuning network 420 and the second RF tuning network 422.

An output of the first RF tuning network 420 is coupled to an input of the first voltage doubler 430. An output of the second RF tuning network 422 is coupled to an input of the second voltage doubler 432. An output of the second voltage doubler 432 is coupled to an input of the first voltage doubler 430. An output of the first voltage doubler 430 is coupled to a system output 450. Thus, the system 400 has a single output 450.

Each of the first RF tuning network 420 and the second RF tuning network 422 can be the same or similar in structure and/or function to any of the tuning networks described herein. For example, one or both of the first RF tuning network 420 and the second RF tuning network 422 can include a Q-multiplied voltage circuit. Each of the first voltage doubler 430 and the second voltage doubler 432 can be the same or similar in structure and/or function to any of the voltage doublers described herein.

As shown, in some embodiments, the first RF tuning network 420 can be operatively coupled to the antenna 410 and configured to receive at least a portion of a radio-frequency (RF) power received via the antenna 410 and to output a first RF power based on the portion of RF power received at the first RF tuning network 420. The first RF power can have a first voltage level. The first voltage doubler 430 can be operatively coupled to the first RF tuning network 420 and configured to receive the first RF power and output a first multiplied RF power having a second voltage level associated with (e.g., based on and/or greater than) on the first voltage level. The second RF tuning network 422 can be operatively coupled to the antenna 410 and electrically coupled in parallel to the first RF tuning network 420. The second RF tuning network 422 can be configured to receive at least a portion of the RF power received via the antenna 410 and to output a second RF power based on the portion of the RF power received at the second RF tuning network 422. The second RF power can have a third voltage level. The second voltage doubler 432 can be operatively coupled to the second RF tuning network 422 and configured to receive the second RF power and output a second multiplied RF power having a fourth voltage level associated with (e.g., based on and/or greater than) the third voltage level. Although described as voltage doublers, in some embodiments, the first voltage doubler 430 and the second voltage doubler 432 can each be a rectifier other than a voltage doubler, such as a voltage multiplier other than a voltage doubler.

In some embodiments, the RF front-end tuning network 440 can be configured to receive RF power from the antenna 410, to send the portion of the RF power to the first RF tuning network 420 such that the portion of RF power received at the first RF tuning network 420 is a first front-end RF power, and to send the portion of the RF power to the second RF tuning network 422 such that the portion of RF power received by the second tuning network 422 is a second front-end RF power.

Figure 5:
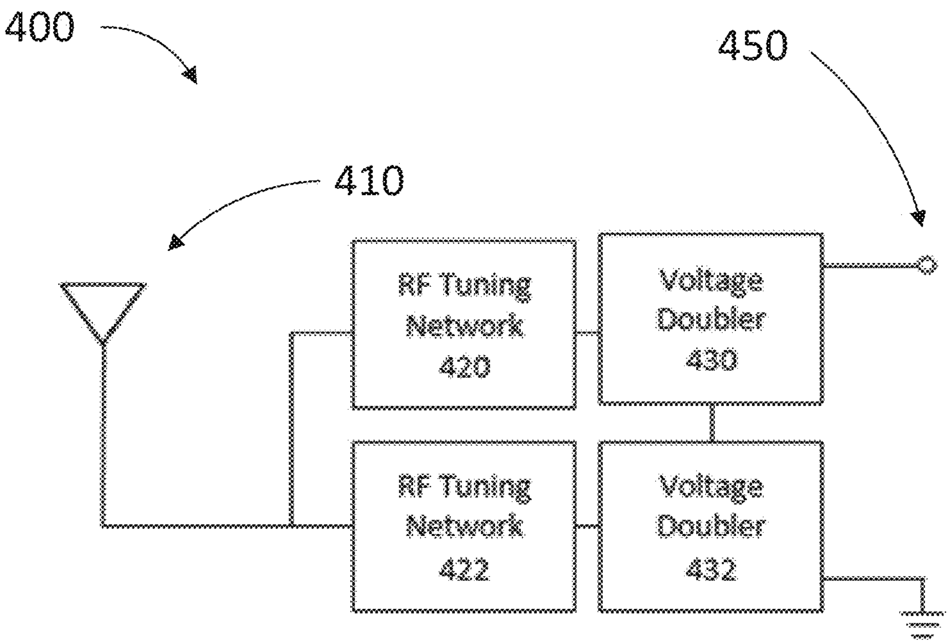
FIG. 5 is a schematic illustration of a variation of the system shown in FIG. 4, according to an embodiment.

In some embodiments, the system 400 does not include an RF front-end tuning network. For example, FIG. 5 is a schematic illustration of a variation of the system 400 shown in FIG. 4 without the RF front-end tuning network 440. Thus, the first RF tuning network 420 and the second RF tuning network 422 are each configured to receive at least a portion of an RF signal received via the antenna 410. Similarly as shown in FIG. 4, the two RF tuning networks 420, 422 are coupled in a parallel configuration, each of the two RF tuning networks 420, 422 are coupled to a respective voltage doubler 430, 432, and the system 400 has a single output 450.

In some embodiments, the first voltage doubler 430 can be operatively coupled to the second voltage doubler 432 such that the second voltage doubler 432 is configured to receive the first multiplied RF power from the first voltage doubler 430 and the second multiplied RF power can be based on the second RF power and the first multiplied RF power. The fourth voltage level can be based on a combination of the second voltage level and the third voltage level.

Figure 6:
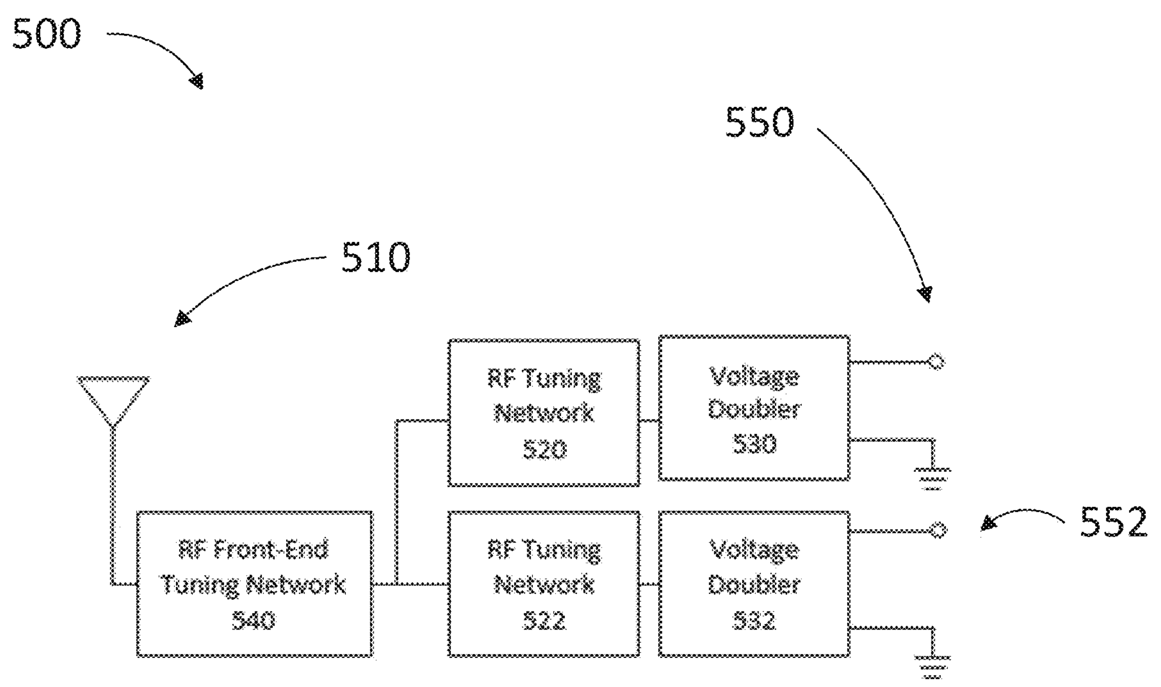
FIG. 6 is a schematic illustration of an energy harvesting system, according to an embodiment.

In some embodiments, an energy harvesting system can include multiple RF tuning networks coupled in a parallel configuration, with each RF tuning network coupled to a respective voltage doubler, and the system can include or be configured to be coupled to multiple system outputs. For example, FIG. 6 is a schematic illustration of an energy harvesting system 500. The system 500 can be the same or similar in structure and/or function to any systems described herein, such as the system 400 of FIG. 4, except that the system 500 includes or is configured to be coupled to a first system output 550 and a second system output 552 rather than a single system output. For example, the system 500 includes an antenna 510, a first RF tuning network 520, a second RF tuning network 522, a first voltage doubler 530, and a second voltage doubler 532. The system 500 also includes an RF front-end tuning network 540 disposed between the antenna 510 and the two tuning networks (i.e., the first RF tuning network 520 and the second RF tuning network 522). The first RF tuning network 520 and the second RF tuning network 522 are coupled in parallel such that an input of each tuning network is coupled to an output of the RF front-end tuning network 540 and configured to receive an output of the RF front-end tuning network 540. The RF front-end tuning network 540 is operatively coupled to the antenna 510 and configured to receive an RF signal from the antenna 510 (i.e., received via the antenna 510) and to provide the RF signal to the first RF tuning network 520 and the second RF tuning network 522.

An output of the first RF tuning network 520 is coupled to an input of the first voltage doubler 530. An output of the second RF tuning network 522 is coupled to an input of the second voltage doubler 532. An output of the first voltage doubler 530 is coupled to a first system output 550. An output of the second voltage doubler 532 is coupled to a second system output 552. Thus, in some embodiments, the first voltage doubler 530 can be configured to provide a first multiplied RF power to the first system output 550 (also referred to as a first apparatus output) independently of the second voltage doubler 532 providing a second multiplied RF power to the second system output 552 (also referred to as a second apparatus output).

Each of the first RF tuning network 520 and the second RF tuning network 522 can be the same or similar in structure and/or function to any of the tuning networks described herein. For example, one or both of the first RF tuning network 520 and the second RF tuning network 522 can include a Q-multiplied voltage circuit. Each of the first voltage doubler 530 and the second voltage doubler 532 can be the same or similar in structure and/or function to any of the voltage doublers described herein.

Figure 7:
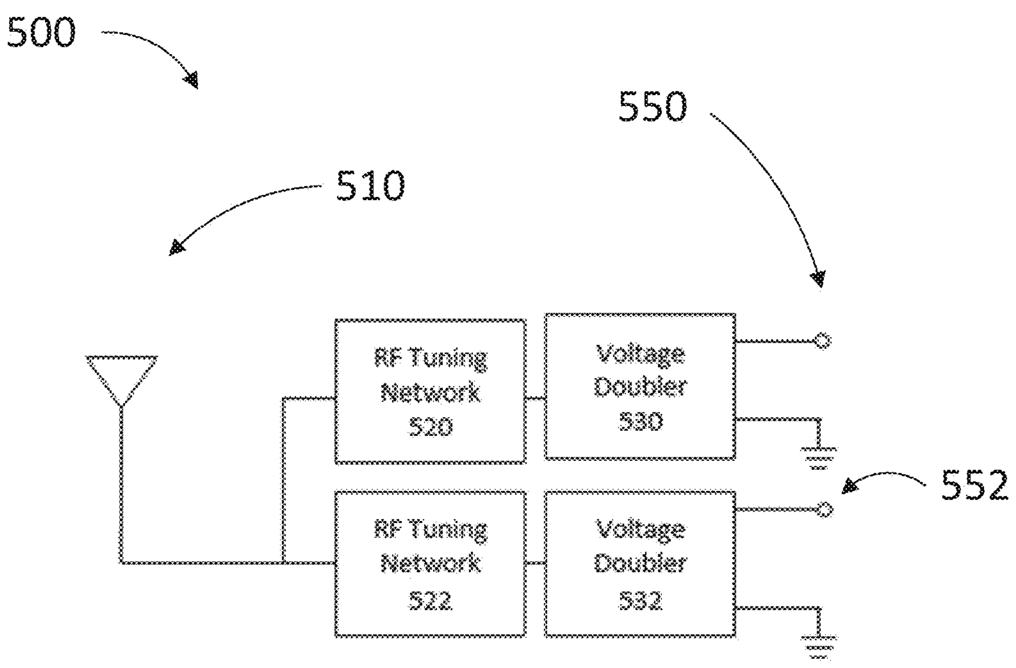
FIG. 7 is a schematic illustration of a variation of the system shown in FIG. 6, according to an embodiment.

In some embodiments, the system 500 does not include an RF front-end tuning network. For example, FIG. 7 is a schematic illustration of a variation of the system 500 shown in FIG. 6 without the RF front-end tuning network 540. Thus, the first RF tuning network 520 and the second RF tuning network 522 are each configured to receive at least a portion of an RF signal received via the antenna 510. Similarly as shown in FIG. 6, the two RF tuning networks 520, 522 are coupled in a parallel configuration, each of the two RF tuning networks 520, 522 are coupled to a respective voltage doubler 530, 532, and the system 500 has a single output 550.

Figure 8:
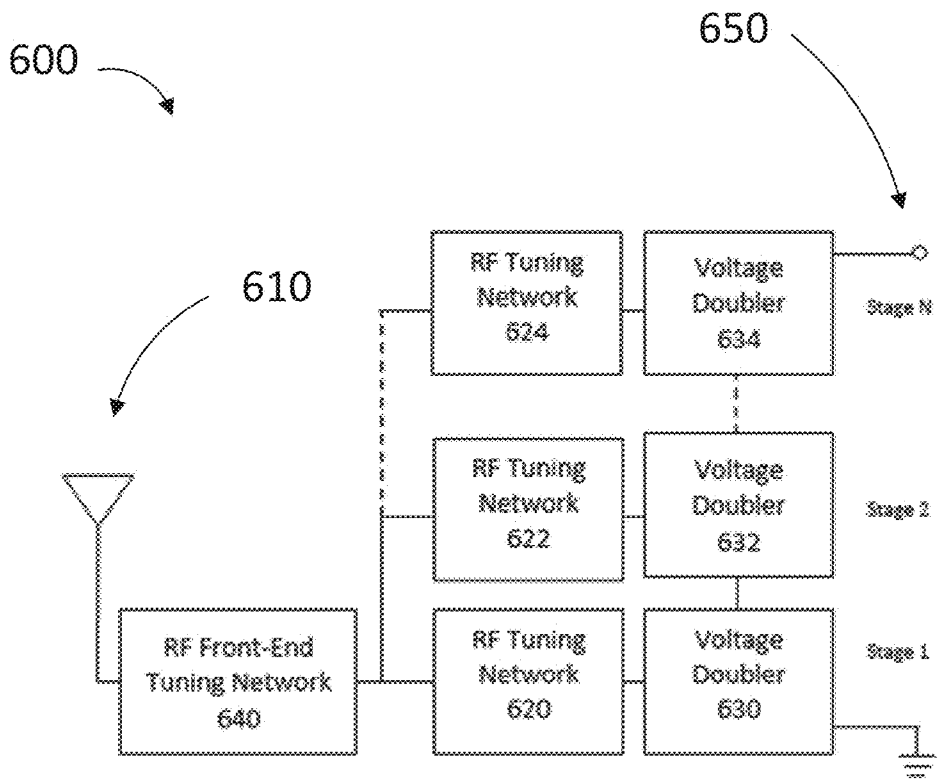
FIG. 8 is a schematic illustration of an energy harvesting system, according to an embodiment.

FIG. 8 is a schematic illustration of an energy harvesting system 600. The system 600 can be the same or similar in structure and/or function to any systems described herein, such as the system 400 of FIG. 4, except that the system 600 can include any suitable number of harvesting stages and/or tuning networks, rather than only the two stages shown in FIG. 4. As shown in FIG. 8, each harvesting stage can include an RF tuning network and a voltage doubler. The system 600 includes an antenna 610, a first harvesting stage including a first RF tuning network 620 and a first voltage doubler 630, a second harvesting stage including a second RF tuning network 622 and a second voltage doubler 632, and N−2 additional stages, each including an RF tuning network and a voltage doubler. As shown, a final stage N can include an Nth RF tuning network 624 and an Nth voltage doubler 634. Thus, the system 600 includes a set of RF tuning networks coupled in parallel to the antenna 610. The system 600 also includes an RF front-end tuning network 640 disposed between the antenna 610 and the set of RF tuning networks (e.g., the RF tuning networks 620, 622, 624). Each of the RF tuning networks included in the system 600 (e.g., RF tuning networks 620, 622, 624) are coupled in parallel such that an input of each tuning network is coupled to an output of the RF front-end tuning network 640 and configured to receive an output of the RF front-end tuning network 640. The RF front-end tuning network 640 is operatively coupled to the antenna 610 and configured to receive an RF signal from the antenna 610 (i.e., received via the antenna 610) and to provide the RF signal to the first RF tuning network 620 and the second RF tuning network 622.

An output of each of the RF tuning networks from the set of RF tuning networks is coupled to an input of a respective voltage doubler. For example, an output of the first RF tuning network 620 is coupled to an input of the first voltage doubler 630. An output of the second RF tuning network 622 is coupled to an input of the second voltage doubler 632. An output of the Nth RF tuning network 624 is coupled to an input of the Nth voltage doubler 634. An output of the first voltage doubler 630 is coupled to an input of the second voltage doubler 632. An output of the second voltage doubler 632 is coupled to an input of the Nth voltage doubler 634. An output of the Nth voltage doubler 634 is coupled to a system output 650. Thus, the system 600 as shown in FIG. 8 has a single output 650.

Each of the RF tuning networks from the set of RF tuning networks of the system 600 (e.g., the first RF tuning network 620, the second RF tuning network 622, and the Nth RF tuning network 624) can be the same or similar in structure and/or function to any of the tuning networks described herein. For example, one, some, or all of the RF tuning networks from the set of RF tuning networks can include a Q-multiplied voltage circuit. Each of the voltage doublers included in the system 600 (e.g., the first voltage doubler

630, the second voltage doubler 632, and the Nth voltage doubler 634) can be the same or similar in structure and/or function to any of the voltage doublers described herein.

As shown, in some embodiments, the first RF tuning network 620 can be operatively coupled to the antenna 610 and configured to receive at least a portion of a radio-frequency (RF) power received via the antenna 610 and to output a first RF power based on the portion of RF power received at the first RF tuning network 620. The first RF power can have a first voltage level. The first voltage doubler 630 can be operatively coupled to the first RF tuning network 620 and configured to receive the first RF power and output a first multiplied RF power having a second voltage level associated with (e.g., based on and/or greater than) on the first voltage level. The second RF tuning network 622 can be operatively coupled to the antenna 610 and electrically coupled in parallel to the first RF tuning network 620. The second RF tuning network 622 can be configured to receive at least a portion of the RF power received via the antenna 610 and to output a second RF power based on the portion of the RF power received at the second RF tuning network 622. The second RF power can have a third voltage level. The second voltage doubler 632 can be operatively coupled to the second RF tuning network 622 and configured to receive the second RF power and output a second multiplied RF power having a fourth voltage level associated with (e.g., based on and/or greater than) the third voltage level. Although described as voltage doublers, in some embodiments, the first voltage doubler 630 and the second voltage doubler 632 can each be a rectifier other than a voltage doubler, such as a voltage multiplier other than a voltage doubler.

In some embodiments, as described, the first RF tuning network 620 and the first voltage doubler 630 are included in a first harvesting stage, the second RF tuning network 622 and the second voltage doubler 632 are included in a second harvesting stage, and the third RF tuning network 624 and the third voltage doubler 634 are included in a third harvesting stage. The third RF tuning network 624 can be operatively coupled to the antenna 610 and electrically coupled in parallel to the first RF tuning network 620 and the second RF tuning network 622. The third RF tuning network 624 can be configured to receive at least a portion of the RF power received via the antenna 610 and to output a third RF power based on the portion of the RF power received at the third RF tuning network 624. The third RF power can have a fifth voltage level. The third voltage doubler 634 can be operatively coupled to the third RF tuning network 624 and configured to receive the third RF power and output a third multiplied RF power having a sixth voltage level associated with (e.g., based on and/or greater than) the fifth voltage level.

In some embodiments, the first voltage doubler 630 can be operatively coupled to the second voltage doubler 632 such that the second voltage doubler 632 is configured to receive the first multiplied RF power from the first voltage doubler 630 and the second multiplied RF power is based on the second RF power and the first multiplied RF power. The fourth voltage level can be based on a combination (e.g., a sum or function) of the second voltage level and the third voltage level. The second voltage doubler 632 can be operatively coupled to the third voltage doubler 634 such that the third voltage doubler 634 is configured to receive the second multiplied RF power from the second voltage doubler 632 and the third multiplied RF power is based on the third RF power and the second multiplied RF power. The sixth voltage level can be based on a combination (e.g., a sum or function) of the fourth voltage level and the fifth voltage level.

Although FIG. 8 shows the system 600 as having a single system output 650 coupled to the voltage doubler 634, in some embodiments, although not shown, each of the voltage doublers in the system 600 can include an output coupled or couplable to a respective system output, similarly as shown with respect to outputs 550 and 552 in FIG. 7. Therefore, the voltage doublers in the system 600 may not be directly coupled to any other voltage doubler. Thus, the system 600 can include multiple system outputs rather than only a single system output 650.

For example, in some embodiments, the first voltage doubler 630 can be operatively coupled to a first apparatus output, the second voltage doubler 632 can be operatively coupled to a second apparatus output, and the third voltage doubler 634 can be operatively coupled to a third apparatus output such that the first voltage doubler 630 is configured to provide the first multiplied RF power to the first apparatus output independently of the second voltage doubler 632 providing the second multiplied RF power to the second apparatus output and independently of the third voltage doubler 634 providing the third multiplied RF power to the third apparatus output.

Figure 9:
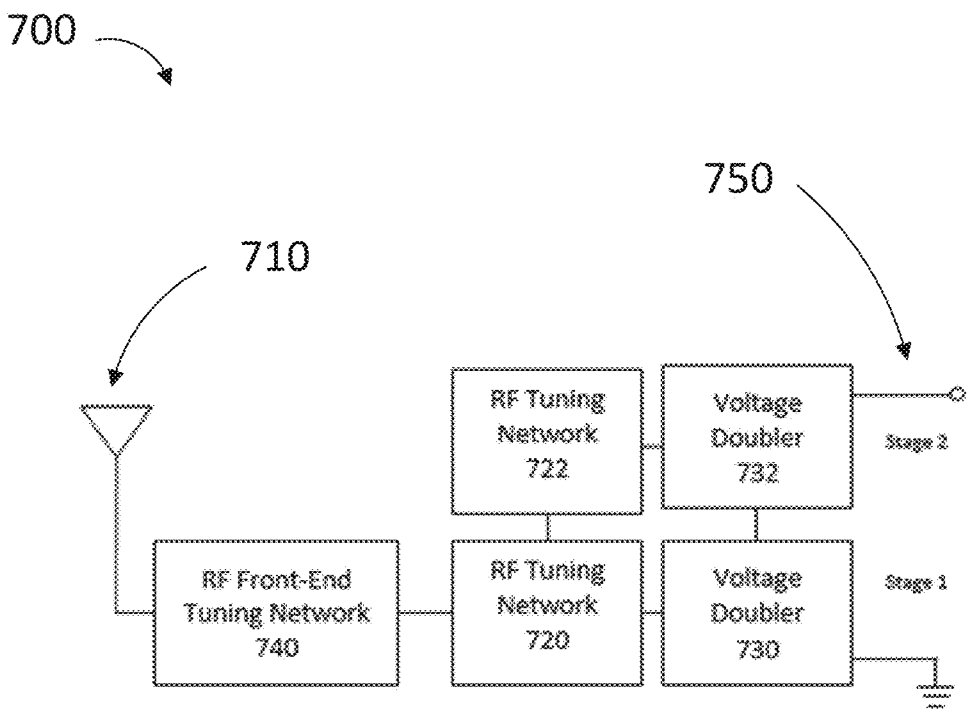
FIG. 9 is a schematic illustration of an energy harvesting system, according to an embodiment.

In some embodiments, an RF front-end tuning network can be coupled directly to only one of the RF tuning networks of a set of RF tuning networks of a system such that the RF front-end tuning network is disposed between an antenna and that RF tuning network. For example, FIG. 9 is a schematic illustration of an energy harvesting system 700. The system 700 includes two RF tuning networks coupled in a parallel configuration, with each of the two RF tuning networks coupled to a respective voltage doubler, and having a single output. As shown, the system 700 includes an antenna 710, a first harvesting stage including a first RF tuning network 720 and a first voltage doubler 730, and a second harvesting stage including a second RF tuning network 722 and a second voltage doubler 732. The system 700 also includes an RF front-end tuning network 740 disposed between the antenna 710 and the first harvesting stage (e.g., the first RF tuning network 720). The RF front-end tuning network 740 is operatively coupled to the antenna 710 and configured to receive an RF signal from the antenna 710 (i.e., received via the antenna 710) and to provide the RF signal to the first RF tuning network 720. The second RF tuning network 722 of the second harvesting stage is coupled to the RF front-end tuning network 740 via the first RF tuning network 720 of the first harvesting stage.

An output of the first RF tuning network 720 is coupled to an input of the first voltage doubler 730. An output of the second RF tuning network 722 is coupled to an input of the second voltage doubler 732. An output of the first voltage doubler 730 is coupled to an input of the second voltage doubler 732. An output of the second voltage doubler 732 is coupled to a system output 750. Thus, the system 700 has a single output 750.

Each of the first RF tuning network 720 and the second RF tuning network 722 can be the same or similar in structure and/or function to any of the tuning networks described herein. For example, one or both of the first RF tuning network 720 and the second RF tuning network 722 can include a Q-multiplied voltage circuit. Each of the first voltage doubler 730 and the second voltage doubler 732 can be the same or similar in structure and/or function to any of the voltage doublers described herein.

Although FIG. 9 shows the system 700 as having a single system output 750 coupled to the second voltage doubler 732, in some embodiments, although not shown, each of the first voltage doubler 730 and the second voltage doubler 732 can include an output coupled or couplable to a respective system output, similarly as shown with respect to outputs 550 and 552 in FIG. 7. Therefore, the first voltage doubler 730 and the second voltage doubler 732 in the system 700 may not be directly coupled to each other and the system 700 can include multiple system outputs rather than only a single system output 750.

Figure 10:
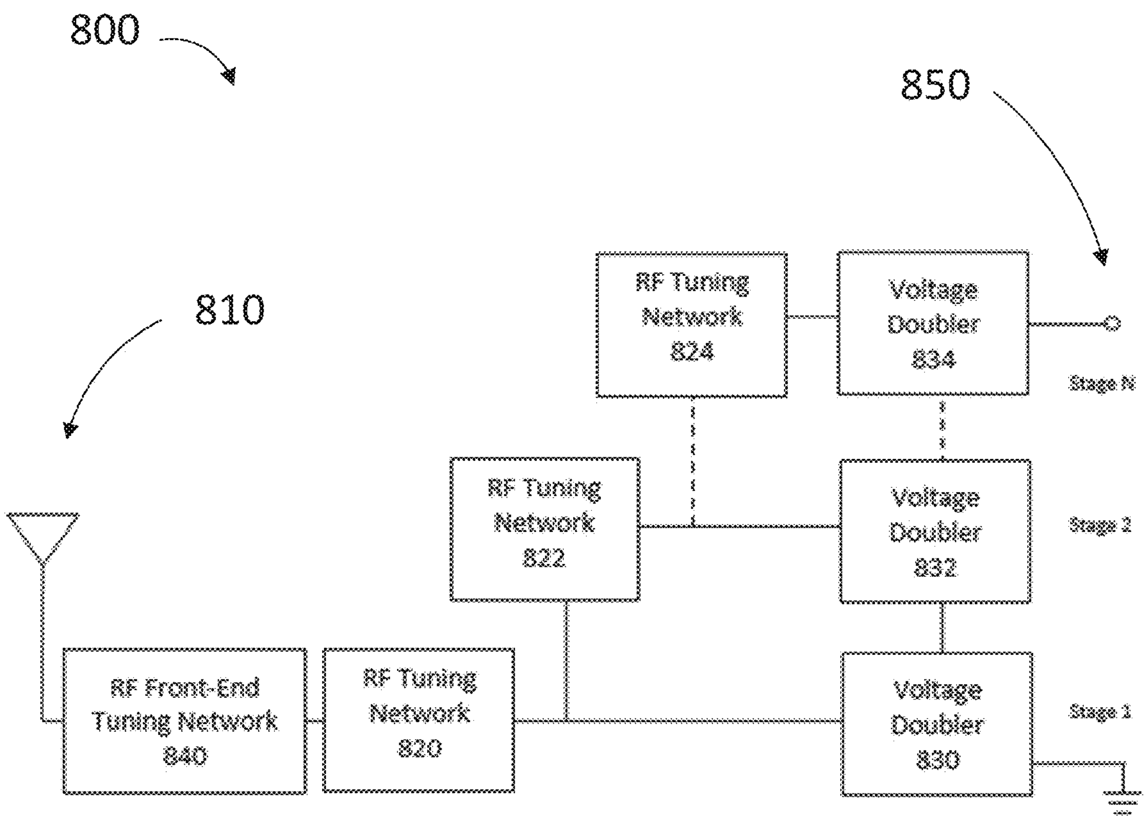
FIG. 10 is a schematic illustration of an energy harvesting system, according to an embodiment.

In some embodiments, a system can include multiple RF tuning networks (e.g., any suitable number N) coupled in stages and each RF tuning network including a Q-multiplied voltage network can be coupled to the system after the previous stage (e.g., after an output of the previous stage). For example, FIG. 10 is a schematic illustration of an energy harvesting system 800. The system 800 can be the same or similar in structure and/or function to any systems described herein. The system 800 can include any suitable number of harvesting stages (e.g., N harvesting stages), and each harvesting stage can include an RF tuning network and a voltage doubler. As shown in FIG. 10, the system 800 includes an antenna 810, a first harvesting stage including a first RF tuning network 820 and a first voltage doubler 830, a second harvesting stage including a second RF tuning network 822 and a second voltage doubler 832, and N−2 additional stages, each including an RF tuning network and a voltage doubler. As shown, a final stage N can include an Nth RF tuning network 824 and an Nth voltage doubler 834.

The system 800 also includes an RF front-end tuning network 840 disposed between the antenna 810 and the first harvesting stage (e.g., the first RF tuning network 820). The RF front-end tuning network 840 is operatively coupled to the antenna 810 and configured to receive an RF signal from the antenna 810 (i.e., received via the antenna 810) and to provide the RF signal to the first RF tuning network 820. The second RF tuning network 822 of the second harvesting stage is coupled to the RF front-end tuning network 840 via the first RF tuning network 820 of the first harvesting stage, and all later RF tuning networks (e.g., the Nth RF tuning network 824) are coupled to the RF front-end tuning network 840 via the RF tuning networks of earlier harvesting stages coupled to the RF front-end tuning network 840. Each RF tuning network of a later stage can have an input coupled to an output of an RF tuning network of a previous stage.

An output of each of the RF tuning networks from the set of RF tuning networks is coupled to an input of a respective voltage doubler. For example, an output of the first RF tuning network 820 is coupled to an input of the first voltage doubler 830. An output of the second RF tuning network 822 is coupled to an input of the second voltage doubler 832. An output of the Nth RF tuning network 824 is coupled to an input of the Nth voltage doubler 834. Additionally, an output of the first voltage doubler 830 is coupled to an input of the second voltage doubler 832. An output of the second voltage doubler 832 is coupled to an input of the Nth voltage doubler 834. An output of the Nth voltage doubler 834 is coupled to a system output 850. Thus, the system 800 as shown in FIG. 10 has a single output 850.

Each of the RF tuning networks from the set of RF tuning networks of the system 800 (e.g., the first RF tuning network 820, the second RF tuning network 822, and the Nth RF tuning network 824) can be the same or similar in structure and/or function to any of the tuning networks described herein. For example, one, some, or all of the RF tuning networks from the set of RF tuning networks can include a Q-multiplied voltage circuit. Each of the voltage doublers included in the system 800 (e.g., the first voltage doubler 830, the second voltage doubler 832, and the Nth voltage doubler 834) can be the same or similar in structure and/or function to any of the voltage doublers described herein.

In some embodiments, for example, the first RF tuning network 820 can be operatively coupled to the antenna 810 and configured to receive radio-frequency (RF) power via the antenna 810 and to output a first RF power based on the received RF power. The first voltage doubler 830 can be operatively coupled to the first RF tuning network 820 and can be configured to receive a portion of the first RF power having a first voltage level from the first RF tuning network 820 and to output a first multiplied RF power having a second voltage level associated with (e.g., based on and/or greater than) the first voltage level. The second RF tuning network 822 can be operatively coupled to the first RF tuning network 820 and configured to receive a portion of the first RF power having the first voltage level from the first RF tuning network 820 and to output a second RF power based on the portion of the first RF power received at the second RF tuning network 822. The second RF power can have a third voltage level associated with (e.g., based on and/or greater than) the first voltage level. The second voltage doubler 832 can be operatively coupled to the second RF tuning network 822 and can be configured to receive the second RF power and output a second multiplied RF power having a fourth voltage level associated with (e.g., based on and/or greater than) the third voltage level. In some embodiments, the first voltage doubler 830 can be operatively coupled to the second voltage doubler 832 such that the second voltage doubler 832 is configured to receive the first multiplied RF power from the first voltage doubler 830 and the second multiplied RF power is associated with (e.g., based on and/or greater than) the second RF power and the first multiplied RF power (e.g., based on a combination of the second RF power and the first multiplied RF power). The fourth voltage level can be associated with (e.g., based on and/or greater than) a combination of the second voltage level and the third voltage level. In some embodiments, the first RF tuning network 820 can be configured to produce a Q-multiplied voltage such that a voltage associated with the first voltage level is Q-multiplied compared to a voltage associated with the received RF power and the second RF tuning network 822 can be configured to produce a Q-multiplied voltage such that a voltage associated with the third voltage level is Q-multiplied compared to a voltage associated with the first voltage level.

The third RF tuning network 824 and the third voltage doubler 834 (and any additional RF tuning networks and voltage doublers included in the N stages of the system 800) can function similarly relative to the second RF tuning network 822 and the second voltage doubler 832 as the second RF tuning network 822 and the second voltage doubler 832 function relative to the first RF tuning network 820 and the first voltage doubler 830. In some embodiments, the RF front-end tuning network 840 can be operatively coupled to the antenna 810 and the first RF tuning network 820. The RF front-end tuning network 840 can be configured to receive RF power from the antenna 810 and to send the RF power to the first RF tuning network 820 such that the RF power received by the first RF tuning network 820 is a front-end tuned RF power.

Although FIG. 10 shows the system 800 as having a single system output 850 coupled to the voltage doubler 834, in some embodiments, although not shown, each of the voltage doublers in the system 800 can include an output coupled or couplable to a respective system output, similarly as shown with respect to outputs 550 and 552 in FIG. 7. Therefore, the voltage doublers in the system 800 may not be directly coupled to any other voltage doubler. Thus, the system 800 can include multiple system outputs rather than only a single system output 850.

For example, in some embodiments, the first voltage doubler 830 can be operatively coupled to a first apparatus output and the second voltage doubler 832 can be operatively coupled to a second apparatus output such that the first voltage doubler 830 is configured to provide the first multiplied RF power to the first apparatus output independently of the second voltage doubler 832 providing the second multiplied RF power to the second apparatus output.

Figure 11:
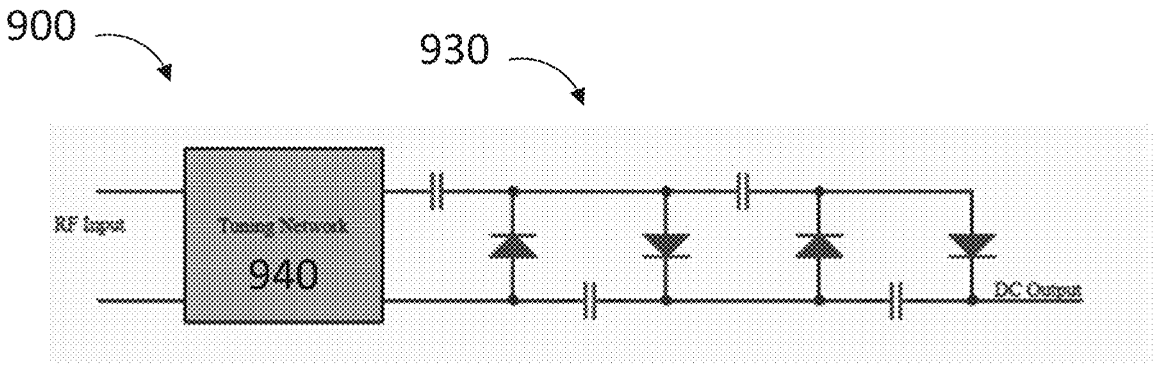
FIG. 11 is a schematic illustration of a system including a multistage voltage multiplier and a front-end tuning network, according to an embodiment.

FIGS. 11-14 are schematic illustrations of various energy harvesting systems or portions thereof, the systems including lumped element networks. FIG. 11 is a schematic illustration of a system 900 including a multistage voltage multiplier 930 and a front-end tuning network 940. FIG. 12 is a schematic illustration of a system 1000 including a multistage voltage multiplier 1030 and inductors such that an LC tank 1020 is included at each harvesting stage. The system 1000 also includes a front-end tuning network 1040. FIG. 13 is a schematic illustration of a system 1100 including a multistage voltage multiplier 1130 and a front-end tuning network 1140. FIG. 14 is a schematic illustration of a system 1200 including a multistage voltage multiplier 1230 and inductors such that an LC tank 1220 is included at each harvesting stage. The system 1200 also includes a front-end tuning network 1240.

Although many of the systems, apparatus, and methods shown and described herein refer to one or more voltage doublers, in some embodiments, rather than one or more voltage doublers, the systems, apparatus, and methods described herein can include any suitable rectifier, such as any suitable voltage multiplier. For example, in some embodiments, rather than including one or more of the voltage doublers 330 and 332, the voltage doublers 430 and 432, the voltage doublers 530 and 532, the voltage doublers 630, 632, and 634, the voltage doublers 730 and 732, and/or the voltage doublers 830, 832, and 834, the systems, apparatus, and method shown and described herein can optionally be replaced with any suitable rectifier (e.g., a voltage multiplier circuit rather than a voltage doubler or another type of rectifying circuit) configured to perform the functions described herein, such as those described with respect to any of the voltage doublers, rectifiers, and/or voltage multipliers described herein.

In some embodiments, the methods, systems, and apparatus described herein to achieve a higher sensitivity harvester circuit (e.g., including an LC tank circuit in a tuning network to achieve a Q-multiplied voltage at one or more stages of voltage multiplication) can be included in an energy harvesting circuit in conjunction with any suitable energy harvesting components and features described in any of U.S. Pat. No. 11,394,246, entitled "Powering Devices Using RF Energy Harvesting," issued Jul. 19, 2022, U.S. Pat. No. 11,245,257, entitled "Method and Apparatus of High Efficiency Rectification for Various Loads," issued Feb. 8, 2022, U.S. Pat. No. 11,418,234, entitled "Bi-Stable Display Tag," issued Aug. 16, 2022, U.S. Pat. No. 10,484,111, entitled "Methods, Systems, and Apparatus for Automatic RF Power Transmission and Single Antenna Energy Harvesting," issued Nov. 19, 2019, U.S. Pat. No. 9,768,711, entitled "RF-DC Power Converter," issued Sep. 19, 2017, and/or U.S. Pat. No. 11,368,053, entitled "Methods, Systems, and Apparatus for Wireless Recharging of Battery-Powered Devices," issued Jun. 21, 2022, which are incorporated by reference herein in their entireties. For example, the inclusion of Q-multiplying components in a multi-stage voltage multiplier as described herein can be included in a system in parallel with other harvesters tuned for higher input power levels. The higher sensitivity harvester circuit including Q-multiplying components in one or more stages of a voltage multiplier can provide power at low input powers while the high input power harvesters can provide power at high input powers. This enables increased system efficiency while maintaining a high system sensitivity.

In some embodiments, the higher sensitivity design described herein may be placed (e.g., electrically coupled) in parallel with a Radio Frequency Identification (RFID) integrated circuit (IC), allowing the increased sensitivity of the harvester to bias the RFID IC to increase the read and write range of the RFID IC.

As used herein, the singular forms "a," "an" and "the" include plural referents unless the context clearly dictates otherwise. While various embodiments of the invention have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above.

While various embodiments of the invention have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above.

In some embodiments, the systems (or any of its components) described herein can include a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to: magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices.

Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

Although various embodiments have been described as having particular features and/or combinations of components, other embodiments are possible having a combination of any features and/or components from any of the embodiments where appropriate.

The invention claimed is:

1. An apparatus, comprising:

an antenna configured to output a first radio-frequency (RF) power having a first voltage level;

a first tuning network operatively coupled to the antenna and configured to receive at least a portion of the first RF power and to output a second RF power based on the portion of the first RF power, the second RF power having a second voltage level;

a first rectifier operatively coupled to the first tuning network and configured to receive the first RF power and output a first multiplied DC power having a third voltage level based on the second voltage level;

a second tuning network operatively coupled to the antenna and electrically coupled in parallel to the first tuning network, the second tuning network configured to receive at least a portion of the first RF power and to output a third RF power based on the first RF power, the third RF power having a fourth voltage level; and a second rectifier operatively coupled to the second tuning network and configured to receive the third RF power and output a second multiplied DC power having a fifth voltage level based on the third voltage level, the first rectifier is operatively coupled to the second rectifier such that (1) the second rectifier is configured to receive the first multiplied DC power from the first rectifier and (2) the second multiplied DC power is based on the third RF power and the first multiplied DC power, the fifth voltage level being based on a combination of the third voltage level and the fourth voltage level.

2. The apparatus of claim 1, further comprising an RF front-end tuning network operatively coupled to the antenna, the first tuning network, and the second tuning network, the RF front-end tuning network configured to receive RF power from the antenna, to send the portion of the RF power to the first tuning network such that the portion of RF power received at the first tuning network is a first front-end RF power, and to send the portion of the RF power to the second tuning network such that the portion of RF power received by the second tuning network is a second front-end RF power.

3. The apparatus of claim 1, wherein the first rectifier is operatively coupled to a first apparatus output and the second rectifier is operatively coupled to a second apparatus output such that the first rectifier is configured to provide the first multiplied DC power to the first apparatus output independently of the second rectifier providing the second multiplied DC power to the second apparatus output.

4. The apparatus of claim 1, wherein the first tuning network and the first rectifier are included in a first harvesting stage of the apparatus, the second tuning network and the second rectifier are included in a second harvesting stage of the apparatus, and the apparatus further comprises:

a third harvesting stage including a third tuning network and a third rectifier, the third tuning network operatively coupled to the antenna and electrically coupled in parallel to the first tuning network and the second tuning network, the third tuning network configured to receive at least a portion of the RF power received via the antenna and to output a fourth RF power based on the portion of the RF power received at the third tuning network, the fourth RF power having a sixth voltage level, the third rectifier operatively coupled to the third tuning network and configured to receive the fourth RF power and output a third multiplied DC power having a seventh voltage level based on the sixth voltage level.

5. The apparatus of claim 4, wherein the second rectifier is operatively coupled to the third rectifier such that the third rectifier is configured to receive the second multiplied DC power from the second rectifier and the third multiplied DC power is based on the fourth RF power and the second multiplied power, the seventh voltage level being based on a combination of the fifth voltage level and the sixth voltage level.

6. The apparatus of claim 4, wherein the first rectifier is operatively coupled to a first apparatus output, the second rectifier is operatively coupled to a second apparatus output, and the third rectifier is operatively coupled to a third apparatus output such that the first rectifier is configured to provide the first multiplied DC power to the first apparatus output independently of the second rectifier providing the second multiplied DC power to the second apparatus output and independently of the third rectifier providing the third multiplied DC power to the third apparatus output.

7. The apparatus of claim 1, wherein the first tuning network is configured to produce a Q-multiplied voltage such that a voltage associated with the first voltage level is Q-multiplied compared to a voltage associated with the portion of RF power received at the first tuning network, and the second tuning network is configured to produce a Q-multiplied voltage such that a voltage associated with the third voltage level is Q-multiplied compared to a voltage associated with the portion of RF power received at the second tuning network.

8. The apparatus of claim 1, wherein the first tuning network is configured to produce a second voltage level higher than a first voltage level, and the second tuning network is configured to produce the fourth voltage level higher than the first voltage level.

9. An apparatus, comprising:

an antenna;

a first tuning network operatively coupled to the antenna and configured to receive radio-frequency (RF) power via the antenna and to output a first RF power based on the received RF power;

a first rectifier operatively coupled to the first tuning network and configured to receive a portion of the first RF power having a first voltage level from the first tuning network and to output a first multiplied RF power having a second voltage level based on the first voltage level;

a second tuning network operatively coupled to the first tuning network and configured to receive a portion of the first RF power having the first voltage level from the first tuning network and to output a second RF power based on the portion of the first RF power received at the second tuning network, the second RF power having a third voltage level based on the first voltage level; and a second rectifier operatively coupled to the second tuning network and configured to receive the second RF power and output a second multiplied RF power having a fourth voltage level based on the third voltage level.

10. The apparatus of claim 9, further comprising an RF front-end tuning network operatively coupled to the antenna and the first tuning network, the RF front-end tuning network configured to receive RF power from the antenna and to send the RF power to the first tuning network such that the RF power received by the first tuning network is a front-end tuned RF power.

11. The apparatus of claim 9, wherein the first rectifier is operatively coupled to the second rectifier such that the second rectifier is configured to receive the first multiplied RF power from the first rectifier and the second multiplied RF power is based on the second RF power and the first multiplied RF power, the fourth voltage level being based on a combination of the second voltage level and the third voltage level.

12. The apparatus of claim 9, wherein the first rectifier is operatively coupled to a first apparatus output and the second rectifier is operatively coupled to a second apparatus output such that the first rectifier is configured to provide the first multiplied RF power to the first apparatus output independently of the second rectifier providing the second multiplied RF power to the second apparatus output.

13. The apparatus of claim 9, wherein the first tuning network is configured to produce a Q-multiplied voltage such that a voltage associated with the first voltage level is Q-multiplied compared to a voltage associated with the received RF power and the second tuning network is configured to produce a Q-multiplied voltage such that a voltage associated with the third voltage level is Q-multiplied compared to a voltage associated with the first voltage level.

14. The apparatus of claim 9, wherein the first rectifier includes a plurality of stages, each stage of the plurality of stages including a tuning network including one or more lumped elements, the plurality of stages including an initial stage configured to receive the portion of the first RF power and produce a power based on the portion of the first RF power, each stage of the plurality of stages coupled to the antenna via at least one previous stage being configured to receive a power from the previous stage and to produce a subsequent power associated with the power received from the previous stage.

15. The apparatus of claim 14, wherein, for each stage from the plurality of stages, the one or more lumped elements from the tuning network for that stage are configured to generate a q-multiplied voltage based on the portion of the first RF power such that the power produced by that stage is a q-multiplied voltage of the portion of the first RF power or the power received from the previous stage by that stage.

16. The apparatus of claim 14, wherein the one or more lumped elements from the tuning network of the initial stage are configured to impedance match the antenna to the first rectifier.

17. The apparatus of claim 14, wherein at least one of the tuning networks are configured to match an impedance of the antenna to an impedance of a component included in a respective stage from the plurality of stages and associated with the at least one of the tuning networks.

18. The apparatus of claim 14, wherein the one or more lumped elements from a tuning network of at least one stage from the plurality of stages are configured to bias at least one remaining stage from the plurality of stages.

19. The apparatus of claim 14, wherein:

the one or more lumped elements include at least one parasitic that includes a junction capacitance of a rectifier of the stage including the one or more lumped elements.

20. The apparatus of claim 14, wherein the one or more lumped elements include (1) a series combination of an inductor and a capacitor (LC), (2) an "L" network including an inductor and a capacitor, or (3) a "Pi" network including a combination of one or more inductors and one or more capacitors.

* * * * *